United States Patent
Tanikawa

(10) Patent No.: US 7,531,823 B2
(45) Date of Patent: May 12, 2009

(54) ELECTRON DEVICE, INTEGRATED ELECTRON DEVICE USING SAME, AND OPERATING METHOD USING SAME

(75) Inventor: Akio Tanikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 374 days.

(21) Appl. No.: 10/543,136

(22) PCT Filed: Jan. 23, 2004

(86) PCT No.: PCT/JP2004/000569

§ 371 (c)(1),
(2), (4) Date: Jul. 25, 2005

(87) PCT Pub. No.: WO2004/066386

PCT Pub. Date: Aug. 5, 2004

(65) Prior Publication Data

US 2006/0139981 A1   Jun. 29, 2006

(30) Foreign Application Priority Data

Jan. 23, 2003   (JP)   ............... 2003-015014

(51) Int. Cl.
*H01L 29/02* (2006.01)
(52) U.S. Cl. ............ 257/2; 257/E27.004; 257/E45.002; 257/E43.004
(58) Field of Classification Search ....... 257/2, 257/3, 4, E27.004, E45.002, E43.005, E43.004; 438/102, 104; 365/113, 163, 148
See application file for complete search history.

(56) References Cited

U.S. PATENT DOCUMENTS

| 2003/0137869 A1* | 7/2003 | Kozicki ............... 365/158 |
| 2003/0186504 A1* | 10/2003 | Li et al. .............. 438/257 |
| 2004/0124407 A1* | 7/2004 | Kozicki et al. ........... 257/9 |

FOREIGN PATENT DOCUMENTS

| JP | 6-28841 | 2/1994 |
| JP | 11-510317 | 9/1999 |
| JP | 2001-502848 | 2/2001 |
| JP | 2001-267513 | 9/2001 |
| JP | 2002-512439 | 4/2002 |
| JP | 2002-246561 | 8/2002 |

\* cited by examiner

*Primary Examiner*—Caridad M Everhart
(74) *Attorney, Agent, or Firm*—Young & Thompson

(57) ABSTRACT

An electronic device includes at least a memory core formed of an alloy serving as an electronic conductor and an electrode provided on each of both ends of the memory core. Data is written on the electronic device by supplying an electric current to allow the alloy composition to be biased. The memory core is formed of an alloy which is in a crystallographically stable state before writing or at the time of data recording and in which a non-equilibrium state accompanying with a solid-solid phase transition can be achieved during temperature increase. In this case, the electronic device operates at a very fast speed by utilizing a metastable state and electromigration which takes place at a very fast rate in a non-equilibrium state during a phase transition, thereby ensuring stable writing or re-writing operation.

24 Claims, 11 Drawing Sheets

FIG.3
(a)
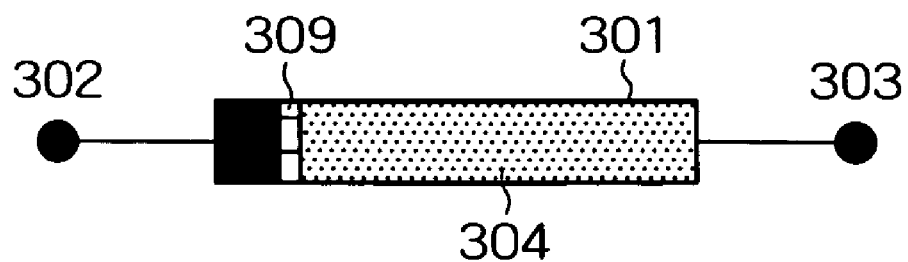
(b)
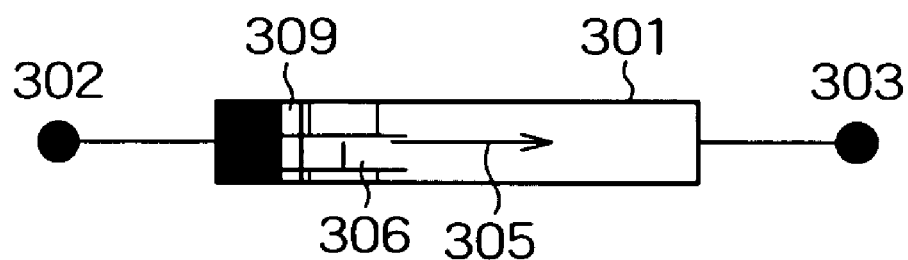
(c)
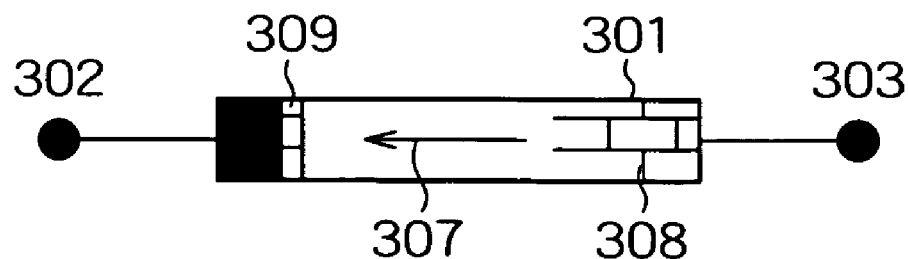

FIG.5
(a)
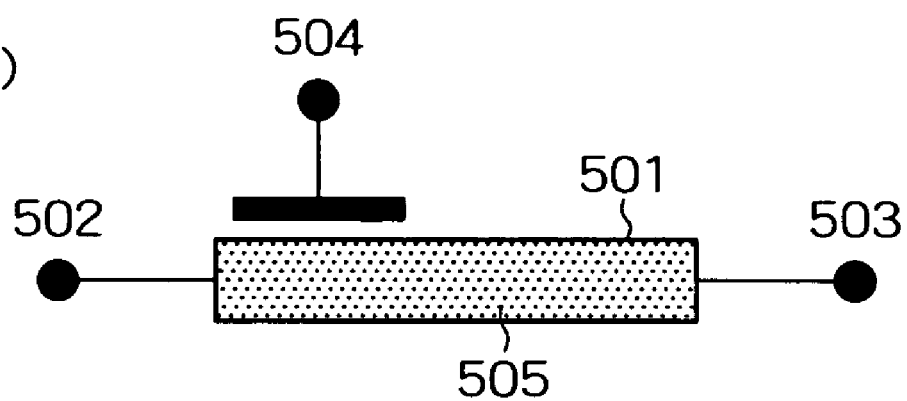
(b)
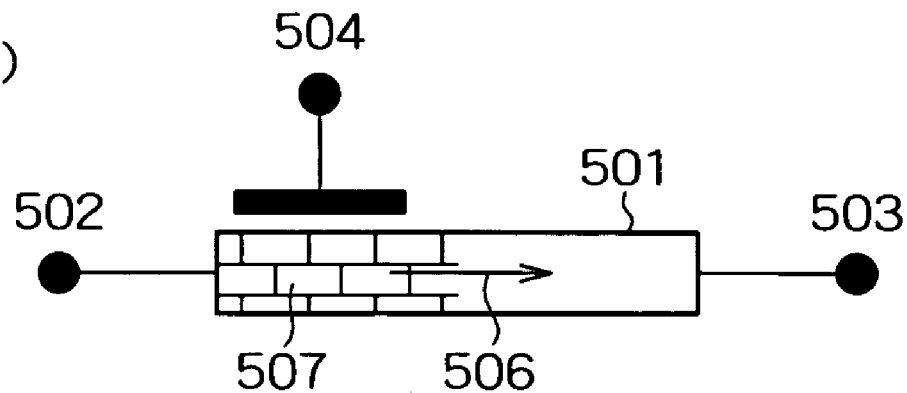
(c)
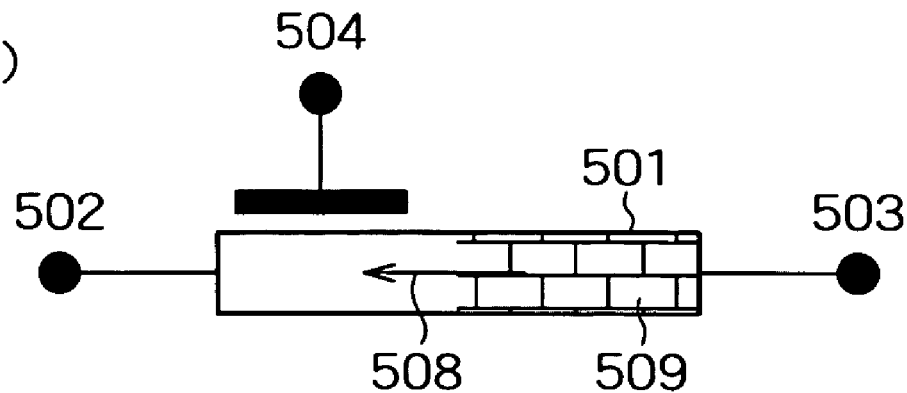

FIG.6
(a)
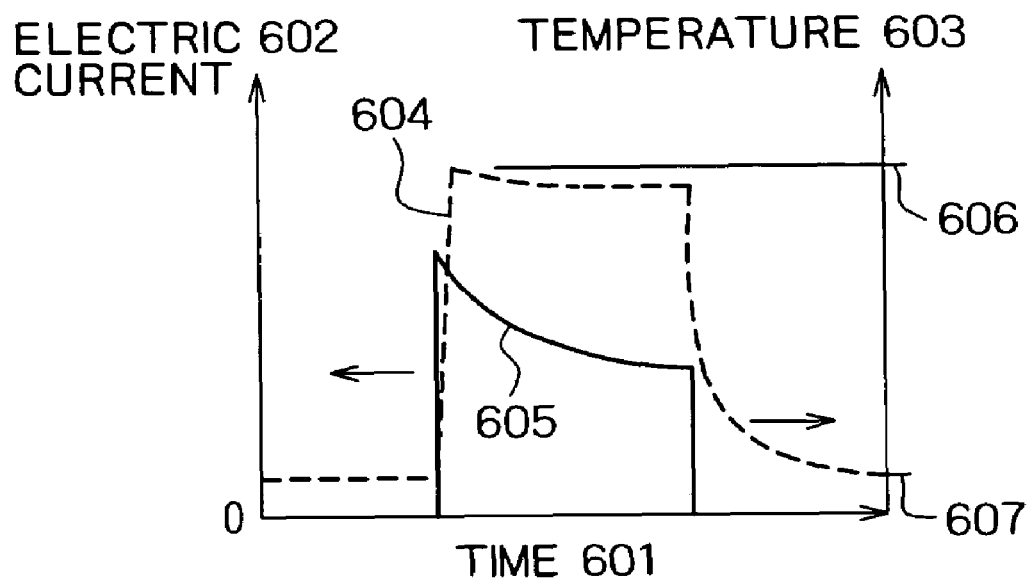
(b)
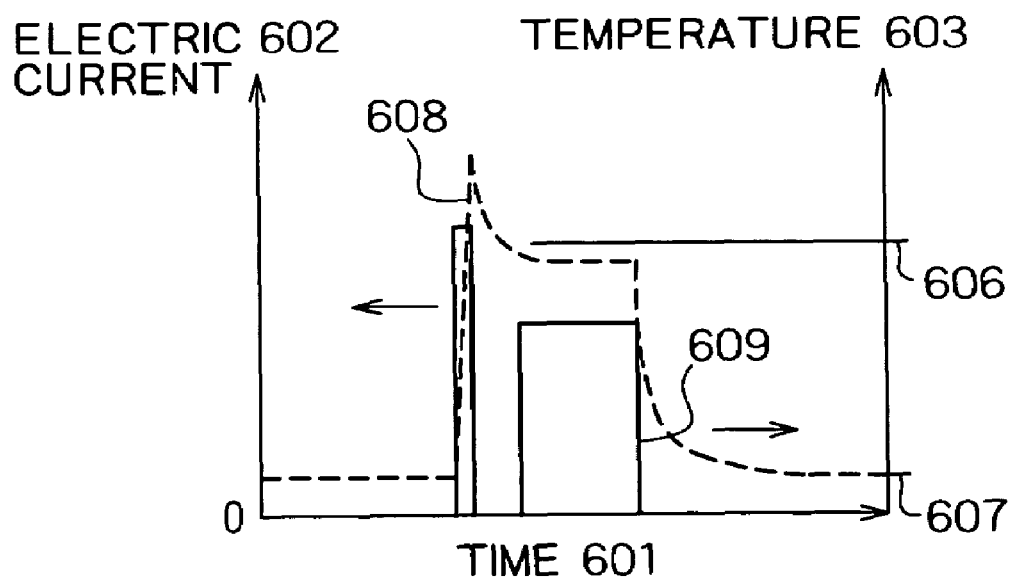

ELECTRON DEVICE, INTEGRATED ELECTRON DEVICE USING SAME, AND OPERATING METHOD USING SAME

TECHNICAL FIELD

The present invention relates to an electronic device and a recording method employing the same. In particular, the present invention relates to an electronic device employing a memory core made of a material in which electromigration takes place upon supplying an electric current, and which changes the composition ratio of at least a part of the element of the material or the shape of the material through the electromigration, and to a recording method using the electronic device.

BACKGROUND ART

Conventionally, in an image recording medium and a recording-reproducing apparatus using the same, a video tape, a digital versatile disk, a hard disk, and the like have mainly been employed. Also, in a music recording medium and a recording-reproducing apparatus using the same, a magnetic tape, a writable compact disk, a flash memory (floating-gate transistors), and the like have mainly been employed. Further, a floppy disk, a hard disk, a digital versatile disk, a writable compact disk, a flash memory, a ferroelectric memory, and the like have been employed for storing data in a computer or the like.

A memory apparatus of a writable type that can maintain stored data after power is shut-off is classified according to a writing method into an apparatus of a type in which a recording medium is scanned or rotated, such as a magnetic recording apparatus, a magneto-optic recording apparatus, and a phase change recording apparatus, and an apparatus of a matrix type in which mechanical scanning or rotation is not required, such as a semiconductor memory and a ferroelectric memory.

The following devices have been known, but they have not been practical for use. Japanese Patent Laid-Open Publication No. Hei 6-28841 discloses a memory apparatus which utilizes atomic or molecular electrophoresis or an electrochemical reaction in an ionic conductive material (an electrolyte). U.S. Pat. No. 3,271,591 discloses a phase change memory which utilizes the characteristics of phase change of chalcogenide caused by a temperature change. Further, in U.S. Pat. No. 5,363,329, a device which utilizes a metal ion precipitating phenomenon in chalcogenide serving as an ionic conductive material has been proposed. However, in the above patent, the ionic migration principle is misidentified or misdescribed as electromigration.

An electronic device which was recognized to utilize electromigration, or the basis of the present invention, includes the electronic device disclosed in Japanese Patent Laid-Open Publication No. Hei 08-293585 and that disclosed in Japanese Patent Laid-Open Publication No. 2001-267513. Although the former device has little practical use, the latter seems to be practical.

However, in a recording-reproducing apparatus of a type which requires scanning or rotation of the above described recording mediums, a mechanically movable portion must be provided, and the limit of size and weight reduction has already been reached. In addition, the mechanical shock resistance thereof is low, and the writing and reading speed is significantly slowed by the time required to move to the recording position on the medium.

A semiconductor memory apparatus such as a flush memory requires complicated production steps, and the cost is high. Therefore, a semiconductor memory apparatus having a large storage capacity comparable to that of a magnetic recording apparatus has not been widely used in practice. Further, a ferroelectric memory having a large storage capacity comparable to that of a magnetic recording apparatus is unlikely to be implemented due to the relatively complicated structure thereof.

A memory apparatus utilizing an electrochemical reaction of an electrolyte has a slow reading-writing speed since a response delay with respect to a high frequency wave or a short-time pulse (caused by a charge accumulation time due to an electric capacity and molecular polarization) always takes place in an ionic conductive material. In addition, the choice of the material which contacts with a chemically active ionic conductive material is limited. Particularly, in order to ensure long-term reliability, a noble metal, a refractory metal, or the like must be employed as an electrode material. Despite this, the long-term durability of the device is still inadequate.

The above Japanese Patent Laid-Open Publication No. Hei 08-293585 discloses a nonvolatile memory device utilizing so-called electromigration. In this case, an alloy composition is biased through supplying an electric current to the alloy serving as an electronic conductor. However, even if the materials, the devices, and the recording methods disclosed in the above publication are fully utilized, the nonvolatile memory device is still far from practical use. The wiring structure disclosed in the above publication is formed of an aluminum alloy and a tungsten electrode (a plug), and is a wiring structure commonly employed in an LSI. Conventionally, the detailed reliability tests for this wiring structure have been repeatedly performed at various temperatures. In this technical field, it is well known that the resistance increase caused by electromigration in the LSI wiring does not take place uniformly, but takes place highly non-uniformly. Therefore, the technology disclosed in the above publication cannot be employed for simultaneous change of a large number of devices with high reproducibility.

The rate of the change caused by electromigration is roughly proportional to the diffusion coefficient of a material and current density. The self-diffusion coefficient of aluminum is approximately $2 \times 10^{-23}$ $m^2/s$ at 200° C. according to the article of H. Mehrer, Landolt-Bornstein New Series III/26 (Springer-Verlag, 1990), and the diffusion coefficient of foreign atoms in aluminum does not exceed ten times of the self-diffusion coefficient of aluminum. Since the diffusion coefficient at 200° C. is approximately ten times larger than that at 80° C., the void generation time at a current density of $1 \times 10^{10}$ $A/m^2$, which was employed at the time of writing in the above Japanese Patent Laid-Open Publication No. Hei 08-293585, can be estimated to be approximately $1 \times 10^7$ s by use of the experimental value (a void formation time at a temperature of 80° C. and a current density of $1 \times 10^9$ $A/m^2$ is approximately $1 \times 10^9$ s) obtained by S. Vaidya, et al. (Appl. Phys. Lett. 36, 464 (1980)). Assuming that only a very small amount of Si precipitation (a layer thickness of 1 nm=$\frac{1}{1,000}$ of a thickness of a void formation region of 1,000 nm) is required and the diffusion coefficient of Si is ten times larger, the writing rate can be estimated to be 1,000 s/bit. Therefore, if the structure and the method disclosed in Japanese Patent Laid-Open Publication No. Hei 08-293585 are merely employed, the required time for writing is 15 minutes per bit, clearly showing impracticality.

A feasible technique for a device utilizing electromigration has been disclosed in Japanese Patent Laid-Open Publication No. 2001-267513. In this case, to solve the above problems, an alloy which has not been employed in an LSI has been employed, and an electrode for detecting atomic segregation is provided. The above publication also discloses that the temperature of the device itself is caused to increase or the device is caused to melt through the Joule heat generated by the electric current fed to the device to thereby allow electromigration to take place at a fast rate.

However, an increase in the rate of the change only by the increase in the device temperature is limited. If the device is caused to melt, the rate of the change significantly increases. However, the reaction with a contacting material is difficult to control, and thus the choice of an electrode material is strongly restricted. Therefore, there is an increasing demand for developing a material in which segregation takes place at a sufficiently fast rate and re-writing is facilitated without melting the device. However, such a material has not been proposed in Japanese Patent Laid-Open Publication No. 2001-267513.

DISCLOSURE OF THE INVENTION

An object of the present invention is to provide an electronic device utilizing electromigration and having a larger storage capacity and a faster reading-writing speed than those of a magnetic recording apparatus, a low manufacturing cost, and compactness comparable to that of a semiconductor memory.

Another object of the present invention is to develop a material which can implement a large storage capacity and a fast reading-writing speed.

A further object of the present invention is to provide an integrated electronic device employing the electronic device having the above characteristics and an operation method using the electronic device.

Incidentally, in Japanese Patent Laid-Open Publication No. 2001-267513, an In—Au alloy and an Sn—Ni alloy or an Sn (75 at. %)-Ni (25 at. %) alloy are disclosed. In each of these exemplary alloys, the alloy composition is not limited. Even if the alloy composition is disclosed, the non-equilibrium state and the metastable state of a solid phase utilized in the present invention described hereinbelow cannot be employed at the disclosed alloy composition. In the invention disclosed in Japanese Patent Laid-Open Publication No. 2001-267513, a concept for utilizing the non-equilibrium state or the metastable state of a solid phase is totally absent.

An electronic device according to a first aspect of the present invention comprises at least a memory core formed of an alloy serving as an electronic conductor and an electrode provided on each of both ends of the memory core, wherein the memory core is formed of an alloy which is a supersaturated solid-solution before writing or at the time of data recording and in which phase separation can take place during temperature increase.

In an electronic device according to a second aspect of the present invention, the memory core is formed of an alloy which is a phase separated mixture before writing or at the time of data recording and in which the formation of a solid-solution can take place during temperature increase.

In an electronic device according to a third aspect of the present invention, the memory core is formed of an alloy which is a compound before writing or at the time of data recording and which includes a component in which phase separation can take place during temperature increase.

In an electronic device according to a fourth aspect of the present invention, the memory core is formed of an alloy which is a phase separated mixture before writing or at the time of data recording and in which a compound can be generated during temperature increase.

In an electronic device according to a fifth aspect of the present invention, the memory core is formed of an alloy which is an amorphous material before writing or at the time of data recording and in which crystallization can take place during temperature increase.

In an electronic device according to a sixth aspect of the present invention, the memory core is formed of an alloy which is a compound before writing or at the time of data recording and which includes a component in which a phase transition to another crystal phase having the same composition can take place during temperature increase.

In an electronic device according to a seventh aspect of the present invention, the memory core is formed of an alloy which is a supersaturated solid-solution or a phase separated mixture before writing or at the time of data recording and in which spinodal decomposition or the formation of a solid-solution which is the inverse process can take place during temperature increase.

In an electronic device according to an eighth aspect of the present invention, the memory core is formed of an alloy which is a compound or a phase separated mixture before writing or at the time of data recording and in which martensitic transformation can take place during temperature increase.

In an electronic device according to a ninth aspect of the present invention, the memory core is formed of an alloy which is in a crystallographically stable state before writing or at the time of data recording and in which a non-equilibrium state accompanying with a solid-solid phase transition can be achieved during temperature increase.

In an electronic device according to a tenth aspect of the present invention, the memory core is formed of an alloy which is in a crystallographically metastable state before writing or at the time of data recording and in which a non-equilibrium state accompanying with a solid-solid phase transition can be achieved during temperature increase.

In each of the above electronic devices, at least one of the electrodes connected to the memory core may be formed of a semiconductor also having a function for detecting a junction resistance.

In addition, the above electronic devices may comprise a third electrode directly connected to the memory core or a third electrode positioned in close proximity of the memory core and insulated from the memory core, the third electrode for detecting a junction resistance, resistance, an electric potential, or an electric capacity.

Further, in the above electronic devices, an interface between the memory core and the electrode directly connected with the memory core preferably has a chemical potential adjusting layer having a thickness of at least 0.1 monolayers or more.

In the above electronic devices, the composition of the alloy forming the electronic device is caused to be biased by supplying an electric current to the electronic device to thereby write data on the electronic device.

An eleventh aspect of the present invention is an integrated electronic device, wherein: a plurality of the above electronic devices are arranged in rows and columns; the electrode connected to one of both the ends of the memory core serves as a word line; the electrode selected from among the other electrodes of the memory core and directly provided on the memory core serves as at least a bit line; and writing-reading operation to the electronic device is achieved by selecting a word line and a bit line to access a certain electronic device of the plurality of electronic devices arranged in rows and columns.

An operation method according to a twelfth aspect of the present invention is an operation method for an electronic device comprising at least a memory core formed of an alloy serving as an electronic conductor and an electrode provided on each of both ends of the memory core, wherein the memory core is formed of an alloy which is a supersaturated solid-solution before writing or at the time of data recording, and a temperature of the memory core is changed such that the supersaturated solid-solution is phase-separated at the time of writing.

In an operation method for the electronic device according to a thirteenth aspect of the present invention, the memory core is formed of an alloy which is a phase separated mixture before writing or at the time of data recording, and a temperature of the memory core is changed such that the phase separated mixture is allowed to form a solid-solution at the time of writing.

In an operation method for the electronic device according to a fourteenth aspect of the present invention, the memory core is formed of an alloy having a component which is a compound before writing or at the time of data recording, and the temperature of the memory core is changed such that the compound is allowed to phase-separate at the time of writing.

In an operation method for the electronic device according to a fifteenth aspect of the present invention, the memory core is formed of an alloy which is a phase separated mixture before writing or at the time of data recording, and the temperature of the memory core is changed such that the phase separated mixture is allowed to generate a compound at the time of writing.

In an operation method for the electronic device according to a sixteenth aspect of the present invention, the memory core is formed of an alloy which is an amorphous material before writing or at the time of data recording, and the temperature of the memory core is changed such that the amorphous material is allowed to crystallize at the time of writing.

In an operation method for the electronic device according to a seventeenth aspect of the present invention, the memory core is formed of an alloy having a component which is a compound before writing or at the time of data recording, and the temperature of the memory core is changed such that a phase transition of the compound to another crystal phase having the same composition is allowed to take place at the time of writing.

In an operation method for the electronic device according to an eighteenth aspect of the present invention, the memory core is formed of an alloy which is a supersaturated solid-solution or a phase-separated mixture before writing or at the time of data recording, and the temperature of the memory core is changed such that the supersaturated solid-solution or the phase-separated mixture is allowed to spinodally-decompose or form a solid-solution which is the inverse process thereof at the time of writing.

In an operation method for the electronic device according to a nineteenth aspect of the present invention, the memory core is formed of an alloy which is a compound or a phase separated mixture before writing or at the time of data recording, and the temperature of the memory core is changed such that martensitic transformation of the compound or the phase separated mixture is allowed to take place at the time of writing.

In an operation method for the electronic device according to a twentieth aspect of the present invention, the memory core is formed of an alloy which is in a crystallographically stable state before writing or at the time of data recording, and the temperature of the memory core is changed such that the alloy is allowed to be in a non-equilibrium state accompanying with a solid-solid phase transition at the time of writing.

In an operation method for the electronic device according to a twenty first aspect of the present invention, the memory core is formed of an alloy which is in a crystallographically metastable state before writing or at the time of data recording, and the temperature of the memory core is changed such that the alloy is allowed to be in a non-equilibrium state accompanying with a solid-solid phase transition at the time of writing.

In the above operation methods, the composition of the alloy forming the electronic device is caused to be biased by supplying an electric current to the electronic device to thereby write data on the electronic device.

The fundamental feature of the present invention is to operate an electronic device at a fast speed through utilizing electromigration which takes place at a very fast rate in a non-equilibrium state during a phase transition from a stable state or a metastable state to thereby ensure stable writing or re-writing operation.

A phase change memory is a known technique and stores the state of a material itself. On the other hand, in the present invention, the state of a material itself is not required to be stored, and also the memory material state to be stored is not required to be two or more. Any material, including a material which recovers the original state (phase) after writing operation, may be employed so long as a phase transition takes place at the instant of writing.

In the present application, the metastable state shall refer to a non-equilibrium state having a very long life and accompanied with a thermodynamical phase transition. Examples of the metastable state include a supercooled state (including a delay of phase separation and the generation of a compound), a supersaturated state (including a state in which an excessive amount is dissolved in a solid-solution), an amorphous state, and the like. These phenomena are induced by the microsizing effects or the surface or interface effects caused by the formation of a thin film or a microprocessing, the formation of an alloy thin film through simultaneous deposition, rapid cooling, or the like. Although, in some cases, a supercooled state, a supersaturated state, and the like caused by rapid cooling and having a long life are classified into a non-equilibrium state in a strict sense, these are classified into a metastable state in the present application.

In the present application, a non-equilibrium state shall refer only to a non-equilibrium state which exists in a short period of time during a general phase transition.

In order to utilize rapid electromigration in the above-described non-equilibrium state, the memory core is required to be formed of a material in which a phase transition takes place at a temperature within the temperature range which includes the temperature of the memory core caused to increase at the time of operation. In a certain material, a phase transition occurs from a thermodynamically stable state through temperature increase, but the kinds of these materials are limited. A metastable state is present in a wide range of alloy systems. If a phase transition from such a metastable state is utilized, the material for the memory device can be selected from a wide variety of materials upon designing the memory device, thereby facilitating the manufacture of the device having the desired characteristics.

Examples of the phase transition caused by temperature increase include: (1) phase separation from a solid-solution or a supersaturated solid-solution; (2) the formation of a solid-solution from a phase separated mixture; (3) phase separation from a compound; (4) the generation of a compound from a phase separated mixture; (5) crystallization from an amorphous state; (6) a phase transition to another crystal structure having the same composition; (7) spinodal decomposition; and (8) martensitic transformation.

A metastable state generated by rapid cooling or a size effect may be employed as the starting state (a state in which a memory device is blank or a storage state) of the phase transition described above.

In some cases, a particular configuration for maintaining the metastable state must be provided. For example, a certain supersaturated solid-solution starts phase-separating upon merely contacting with an electrode material to thereby cause segregation in the electrode. In such a material, a layer for adjusting the chemical potential difference on the surface or the interface must be provided on the interface between an electrode and a memory core. Specifically, the chemical potential adjusting layer can be implemented by chemically adsorbing atoms such as hydrogen, halogen, oxygen, and nitrogen on the surface of an electrode or a memory core. The chemical potential adjusting layer on the interface should not act as an insulative film, but any insulative film may be employed as the chemical potential adjusting layer on the interface so long as the insulative film has a thickness thin enough to freely pass electrons therethrough by tunneling conduction. The amount of adsorbed atoms should be approximately 0.1 monolayers or more, when one monolayer is defined as the total number of atomic bonds on the interface. The thickness of the insulative layer should be approximately 2 nm or less for allowing electrons to freely pass through the insulative layer by tunneling conduction.

BRIEF DESCRIPTION OF THE DRAWINGS

FIG. 3 includes cross-sectional views of the main parts of the device for explaining a first embodiment of the electronic device of the present invention.

FIG. 5 includes cross-sectional views of the main parts of the device for explaining a third embodiment of the electronic device of the present invention.

FIG. 6 includes (*a*) a graph for explaining the electronic device of the present invention when the electronic device is operated near a solubility limit, and (*b*) a graph for explaining the electronic device of the present invention when the electronic device is operated near compound generation temperature.

BEST MODE FOR CARRYING OUT THE INVENTION

Embodiments of the present invention will next be described in detail with reference to the accompanying drawings.

First, the metastable state and the non-equilibrium state of an alloy, which are the main concept defining the present invention, will be described.

Figure 1:
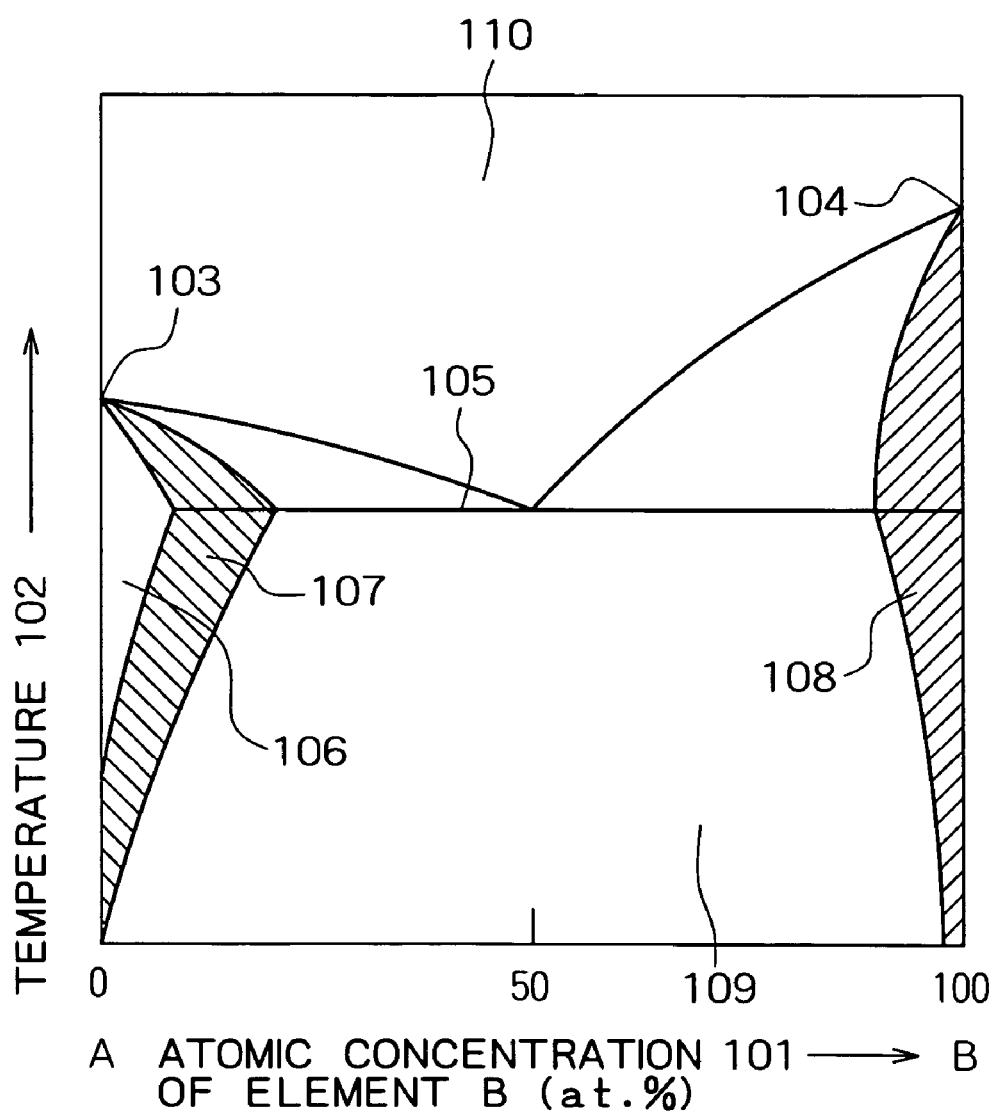
FIG. 1 is a schematic binary phase diagram for explaining an electronic device of the present invention.

FIG. 1 is a binary phase diagram for explaining the concept of the present invention. This binary phase diagram represents an alloy system of a virtual element A and a virtual element B, and the alloy system is a macroscopic system in which the effects of surface and interface can be neglected. As shown in FIG. 1, a solid-solution region 106 of the element B in the element A is represented by an element B atomic concentration 101 and temperature 102. The reference numeral 110 designates a liquid phase region, and 105 designates the eutectic melting point. The reference numeral 103 designates the melting point of the element A, and 104 designates the melting point of the element B. If the microsizing effects caused by forming a thin film or microprocessing are applied to the system, an enlarged metastable solid-solution region 107 emerges in FIG. 1. The alloy having a composition within the metastable solid-solution region 107 at room temperature can be employed as a supersaturated solid-solution in which phase separation can take place upon temperature increase. On the other hand, the alloy having a composition within the crystallographically stable A-B phase-separated region 109 and capable of being in the state of the solid-solution region 106 of the element B in the element A or of the metastable solid-solution region 107 upon temperature increase can be employed as an alloy which can form a solid-solution.

As in the above alloy system of the virtual element A and the virtual element B, the solid-solution region of the element A in the element B is absent in the macroscopic system. However, if the microsizing effects caused by forming a thin film or microprocessing are applied to the system, a metastable solid-solution region 108 may occasionally emerge as shown in FIG. 1. An alloy in this metastable solid-solution region 108 can be employed as the alloy described above.

As a particular example of a phase transition between solid-solution and a phase separated mixture, spinodal decomposition may be employed as in above.

Figure 2:
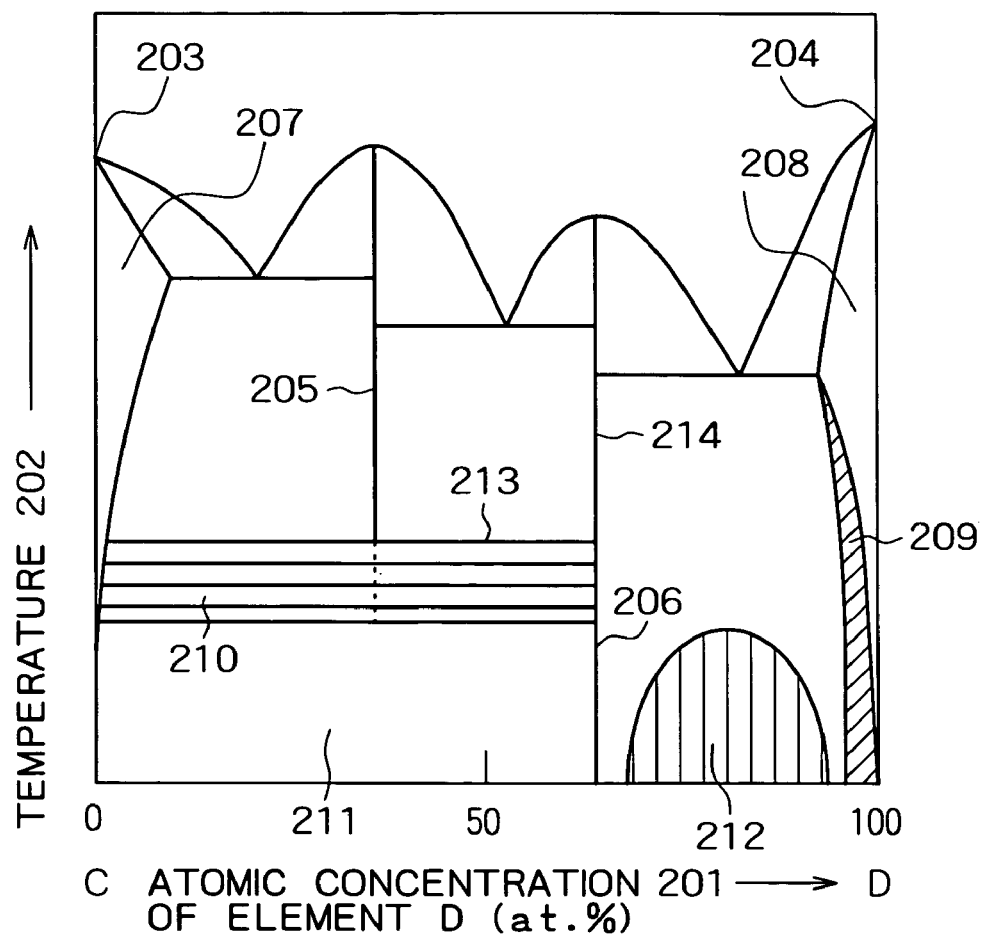
FIG. 2 is a schematic binary phase diagram for explaining the electronic device of the present invention.

FIG. 2 is also a schematic binary phase diagram for explaining the concept of the present invention. The horizontal axis is an element D atomic concentration 201, and the vertical axis is temperature 202. The phase diagram shown in FIG. 2 represents an alloy system of a virtual element C and a virtual element D and illustrates an equilibrium state with respect to a sufficiently slow temperature change. In the phase diagram shown in FIG. 2, assume that a compound X 205 is present at a critical temperature Tc 213 and higher temperatures. In this case, a phase separated mixture at room temperature having a composition in which a phase transition to the compound X 205 takes place upon temperature increase can be employed as a phase separated mixture which can generate a compound. Upon a rapid temperature change, a metastable region 210 containing the compound X emerges and is extended from the critical temperature Tc 213 to lower temperatures. In some cases, this metastable region is extended to room temperature. The metastable compound X can be employed as a compound in which phase separation can take place. Such an extension of the region described above can be metastably caused by microsizing effects.

Also, in the above alloy system of the virtual element C and the virtual element D, the alloy having a composition in which a metastable state amorphous phase 212 is formed upon a rapid temperature change and in which the amorphous phase 212 crystallizes upon temperature increase, as shown in FIG. 2, can be employed as an amorphous material which can crystallize. The amorphous phase 212 may metastably emerge through simultaneous deposition or microsizing effects.

Further, in the above alloy system of the virtual element C and the virtual element D, a solid-solution region 208 of the virtual element C in the virtual element D is present, as shown in FIG. 2. The alloy having a composition in which a compound Y 206 and the element D are separated at room temperature and in which the separated state changes to the solid-solution of the virtual element C in the virtual element D in region 208 upon temperature increase can be employed as a phase-separated mixture which can form a solid-solution upon temperature increase.

In some cases, the compound Y 206 is transformed at the critical temperature Tc 213 to a compound Ya 214 having the same composition through changing the crystal structure. Such a compound Y 206 is a compound in which the phase transition utilized in the present invention can take place. In addition, martensitic transformation can be utilized as a particular example of the phase transition described above. The martensitic transformation is widely known to occur during quenching-annealing of iron, and the additive atoms move at a fast speed at the instant of the phase transition.

In FIG. 2, the reference numeral 203 designates the melting point of the element C, and the reference numeral 204 designates the melting point of the element D. The reference numeral 207 designates a solid-solution region of the element C in the element D, and the reference numeral 209 designates an extended metastable solid-solution region.

A binary alloy has been employed in examples described above, but the alloy is not limited to a binary alloy. A state change caused by temperature change has been described in the above examples, but, in a certain material, a phase transition can be induced through changing, in addition to temperature, pressure, an electric field, a magnetic field, an electromagnetic wave, and the like and the combinations thereof.

The feature of the present invention is to produce an electronic device by use of an alloy material which can utilize the above described metastable state and non-equilibrium state, data being written on the electronic device through biasing an alloy composition by means of electromigration.

The electronic device illustrated in FIG. 3, which is also described in Japanese Patent Laid-Open Publication No. 2001-267513, is a nonvolatile memory device comprising a memory core 301 which is provided on an insulative substrate and is formed of the alloy of the present invention, an electrode A 302 serves also as a sense electrode directly bonded to one end of the memory core 301, and an electrode B 303. The electrode A 302 is formed of a highly doped semiconductor. Just after the formation of the device, diffusing element atoms in the memory core 301 are uniformly distributed over the memory core 301 without segregation, and this state is represented as a uniformly distributed diffusing element 304 shown in FIG. 3(a). The data stored in the electronic device of FIG. 3 is read out through detecting the change of the Schottky barrier caused by the segregation of the diffusing element as the change of junction resistance of the sense electrode (see FIGS. 3(b) and 3(c)).

On the interface between the semiconductor electrode A 302 and the memory core 301, a chemical potential adjusting layer 309 on which atoms, such as hydrogen, halogen, oxygen, or nitrogen, stable on the interface are chemically adsorbed may be provided to prevent unnecessary initial segregation.

At the time of writing to the electronic device, the migration of the diffusing element (304, 306, or 308) must take place. At least the instant of the migration, the migration speed increases by a factor of 100 or more if a phase transition takes place to bring the memory core 301 into a non-equilibrium state. The reference numeral 305 in FIG. 3 designates the electric current flowing from the electrode A 302 to the electrode B 303, and the reference numeral 307 designates the electric current flowing from the electrode B to the electrode A.

The reference numeral 306 designates the diffusing element concentrated on the electrode A side, and the reference numeral 308 designates the diffusing element concentrated on the electrode B side.

Figure 4:
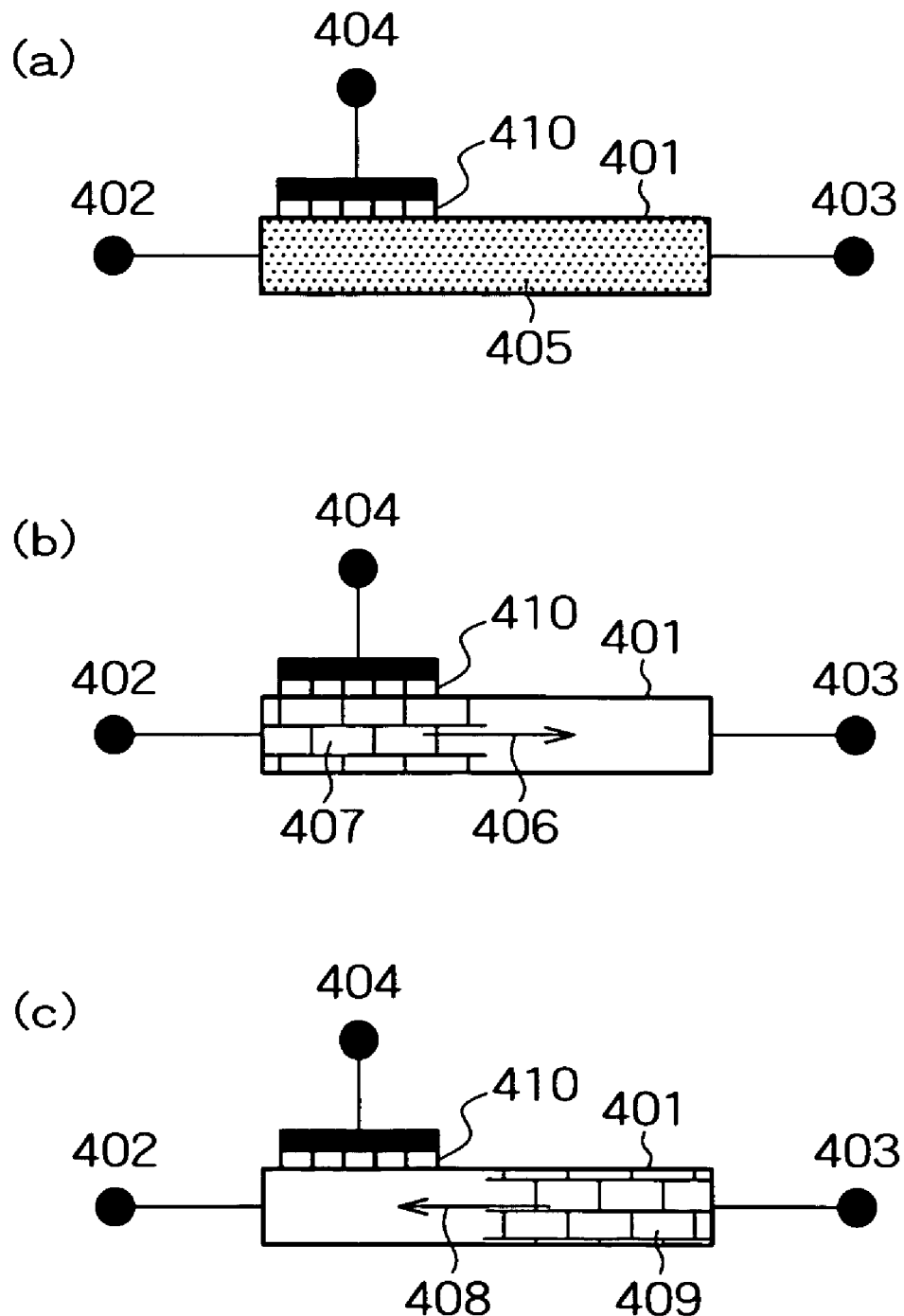
FIG. 4 includes cross-sectional views of the main parts of the device for explaining a second embodiment of the electronic device of the present invention.

FIGS. 4 and 5 illustrate embodiments of the electronic device. These embodiments have also been described in Japanese Patent Laid-Open Publication No. 2001-267513. In these examples, a sense electrode 404 or 504 is provided as a third electrode to read out data through detecting the junction resistance or the electric potential difference. Writing operation is performed in these examples as the same manner in the above example. The third electrode 404 is a sense electrode of a direct bonding type, and the third electrode 504 is a sense electrode positioned in close proximity of the memory core and insulated from the memory core.

In FIGS. 4 and 5, the reference numerals 401 and 501 are memory cores. The reference numerals 402 and 502 are electrodes A, and the reference numerals 403 and 503 are electrodes B. The reference numerals 405 and 505 are uniformly distributed diffusion elements. The reference numerals 406 and 506 are electric currents flowing from the electrode A to the electrode B, and the reference numerals 408 and 508 are electric currents flowing from the electrode B to the electrode A. The reference numerals 407 and 507 are diffusing elements concentrated on the electrode A side, and the reference numerals 409 and 509 are diffusing elements concentrated on the electrode B side.

The above embodiments may be formed by employing various materials including inorganic materials and organic materials.

The characteristics of the above-described materials of the present invention are induced by an operation method of the electronic device. An operation method for utilizing the temperature change of the memory core itself by means of the Joule heat generated by the electric current fed to the memory core during the time of writing will next be described.

FIG. 6(a) is a schematic graph for explaining the operation of the electronic device of the present invention near a solubility limit. The horizontal axis represents a writing operation elapsed time 601, and the vertical axis represents an electric current 602 and temperature 603. During a short initial period of the writing operation, a device current 605 is fed such that Joule heat is generated to raise device temperature 604 higher than a solubility temperature 606. Subsequently, the device current 605 is controlled such that Joule heat enough to keep the device temperature 604 slightly lower than the solubility temperature 606 is generated. In this manner, once all impurities are caused to dissolve into a solid-solution, the impurities are distributed uniformly. The uniformly distributed impurity atoms can then segregate at a fast rate to the desired electrode side through electromigration. The reference numeral 607 is room temperature.

FIG. 6(b) is a graph for explaining the operation of the electronic device of the present invention near a compound generation temperature. During a short initial period of writing operation, a device current 609 is fed during a very short period of time such that Joule heat is generated to raise device temperature 608 higher than a phase transition temperature 610 of the generation of the compound. Subsequently, the device current is once brought to zero, and then the device current 609 is fed and maintained such that Joule heat enough to keep the device temperature 608 slightly lower than the phase transition temperature 610 is generated. In this manner, once a compound is allowed to generate, impurities are distributed uniformly. The uniformly distributed impurities can then segregate at a fast rate to the desired electrode side through electromigration.

In the above examples of the operation, the Joule heat generated in the memory core through the device current is utilized, but a heat source may be provided near the device to control the temperature. In a certain material, a phase transition caused by changing ambient conditions including, in addition to temperature, pressure, an electric field, a magnetic field, an electromagnetic wave, light, and the like and the combinations thereof has similar effects.

EMBODIMENTS

Specific Embodiments of the present invention will next be described with reference to the drawings.

Figure 7:
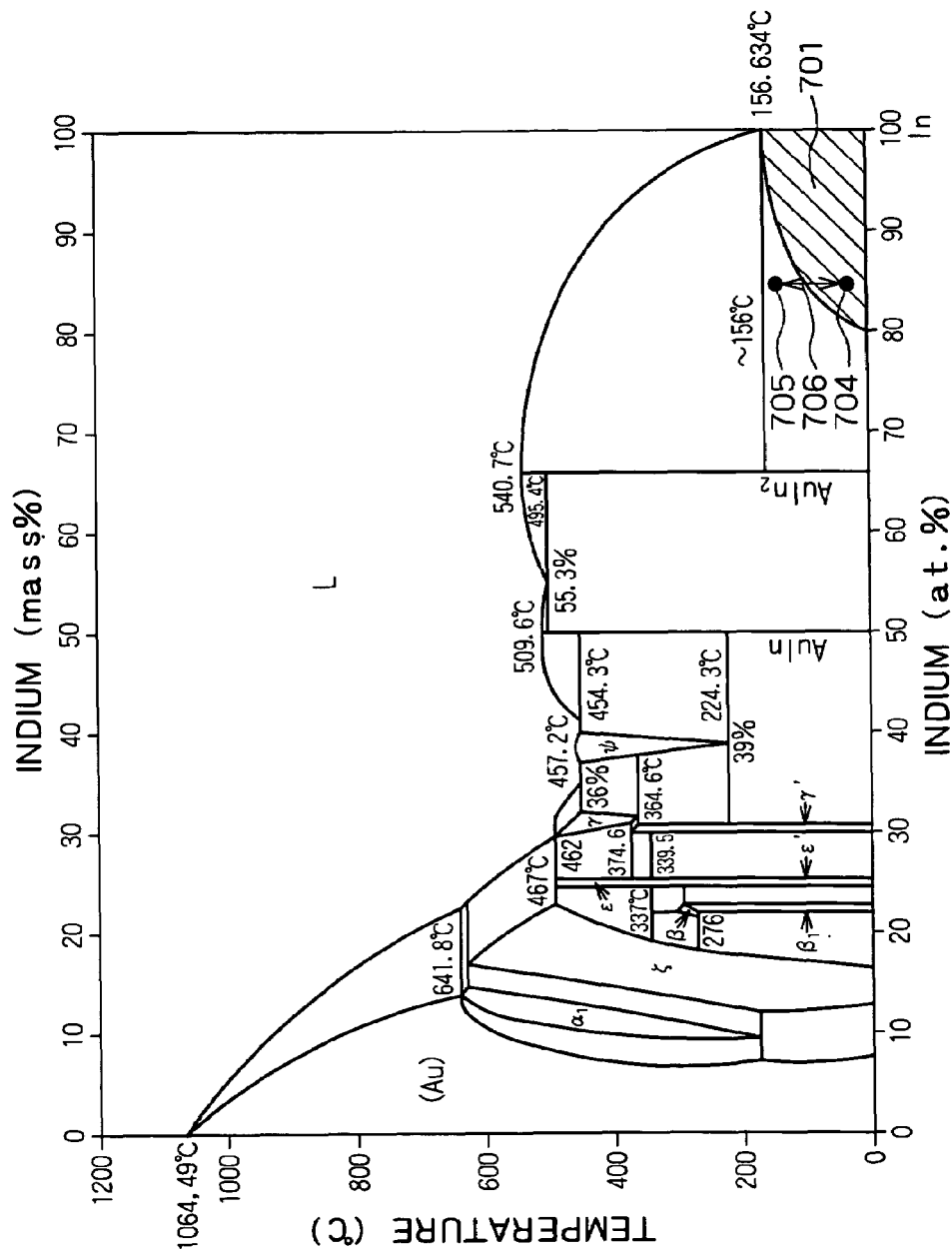
FIG. 7 is an Au—In binary phase diagram illustrating an embodiment of the present invention.

FIG. 7 is an Au—In binary phase diagram illustrating a first embodiment of the present invention. According to BINARY ALLOY PHASE DIAGRAMS 2nd ed. edited by T. B. Massalski (ASM, 1990), Au dissolved in In is undetectable. However, if a thin film having a thickness of 100 nm or less is formed by means of a simultaneous deposition method, a metastable solid-solution region 701 or a solid-solution region (Au dissolves up to 20 at. %) emerges. The metastable solid-solution region 701 is extended or reduced depending on the film thickness. The alloy thin film having a composition within the metastable solid-solution region 701 is easily separated into $In_7O_3$ and $In_2Au_7O_2$ through electromigration. For example, if the memory core is produced from an alloy thin film having an Au concentration of 14 at. % and the state at an initial point 704 of room temperature is brought to a temperature increased point 705 of 140° C. through supplying an electric current, the segregation of $In_2Au_7O_2$ is caused to take place in a very short period of time at the instant of time in which the temperature passes through a phase separation point 706 which is the boundary of the metastable solid-solution region 701. In this material, $In_2Au_7O_2$ can be segregated in either the positive electrode side or the negative electrode side by controlling the magnitude of the electric current. However, once the segregation of $In_2Au_7O_2$ is caused to take place, the uniform state cannon be recovered. Therefore, this material is useful as a material for a write-once device.

Figure 8:
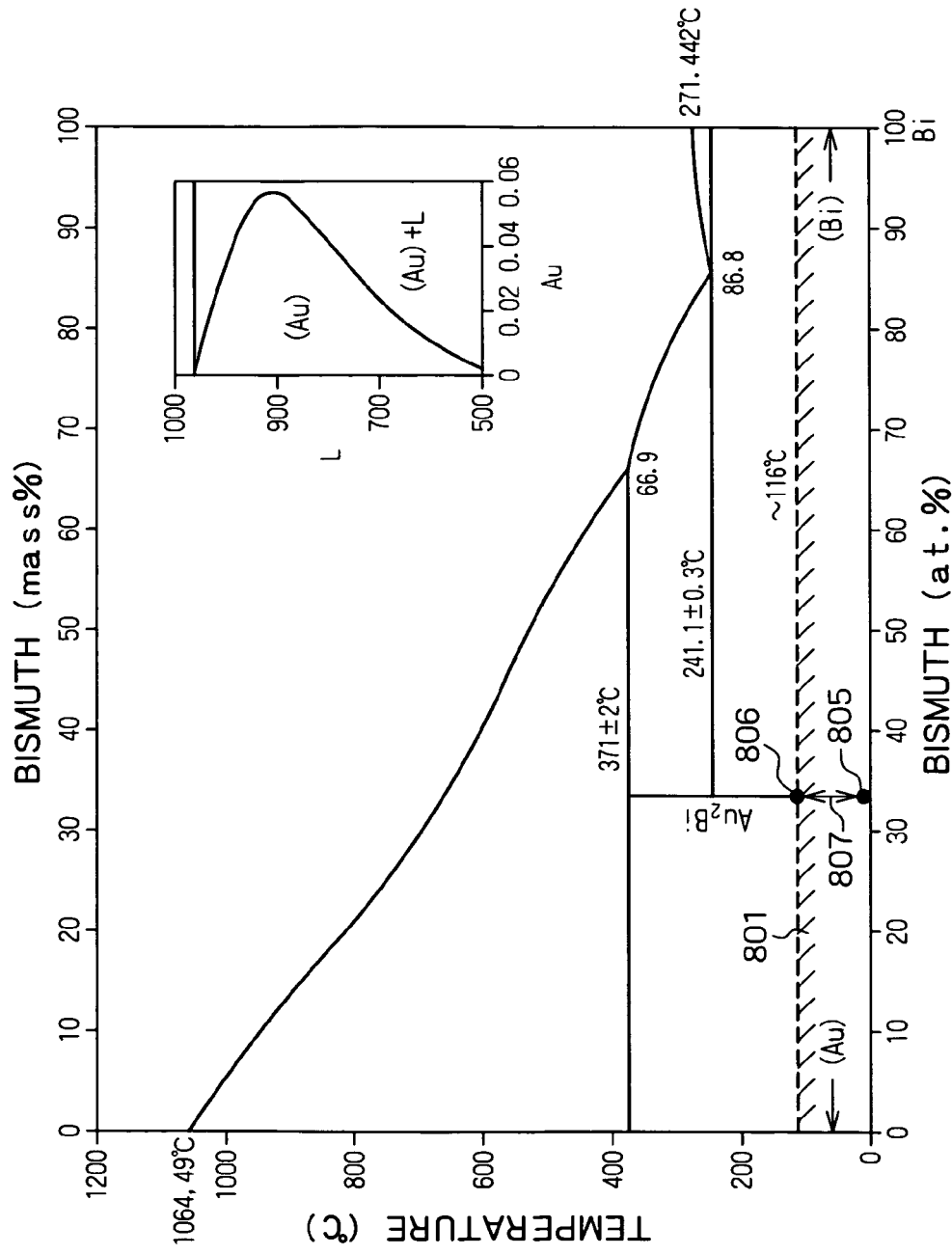
FIG. 8 is an Au—Bi binary phase diagram illustrating an embodiment of the present invention.

FIG. 8 is an Au—Bi binary phase diagram illustrating a second embodiment of the present invention. According to BINARY ALLOY PHASE DIAGRAMS 2nd ed. edited by T. B. Massalski (ASM, 1990), a compound $Au_2Bi_8O_2$ is stable only at a temperature of 116° C. or higher. However, if a thin film having a thickness of 100 nm is rapidly cooled, a non-equilibrium region 801 containing the compound $Au_2Bi_8O_2$ and extending from 116° C. to lower temperatures emerges. The alloy thin film having a composition and a temperature within the non-equilibrium region 801 is separated at a very fast rate into $Au_8O_3$ and $Bi_8O_4$ through electromigration. For example, if the state of the thin film is changed from an initial point 805 of room temperature (Bi: 33.3 at. %) to a temperature increased point 806 of 120° C. through supplying an electric current, the compound $Au_2Bi_8O_2$ is generated from the alloy thin film having $Au_8O_3$ and $Bi_8O_4$ separated each other at the instant of time in which the temperature reaches the phase transition point 807. In the alloy thin film having a composition of $Au_2Bi$, once the temperature is increased to 116° C. or higher during the time of writing, the compound is uniformly generated over the entire alloy. Subsequently, $Bi_8O_4$ can be caused to segregate in the desired electrode side through electromigration while the temperature passes through the phase transition point 807 located at 116° C. or lower. Therefore, this material is useful as a material for a device writable for any number of times if operated through a predetermined method.

Figure 9:
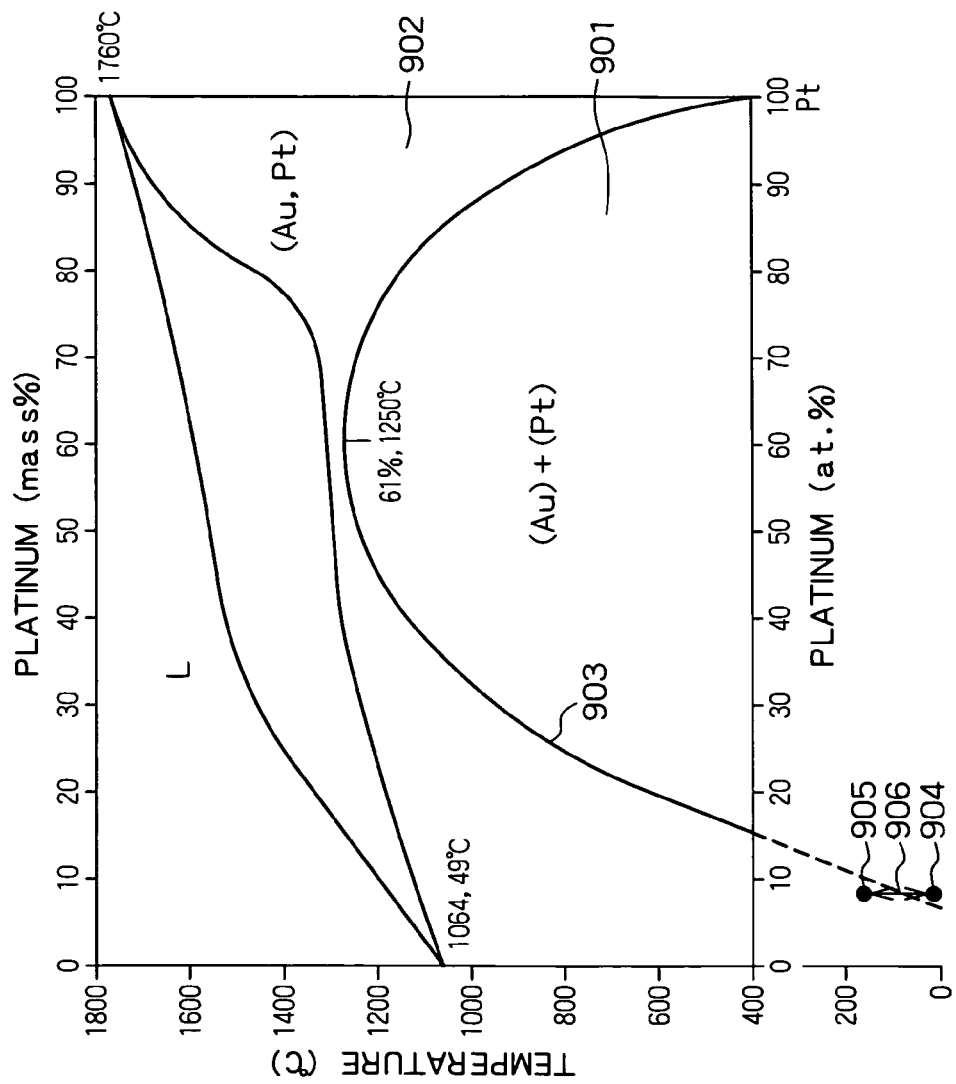
FIG. 9 is an Au—Pt binary phase diagram illustrating an embodiment of the present invention.

FIG. 9 is an Au—Pt binary phase diagram illustrating a third embodiment of the present invention. According to BINARY ALLOY PHASE DIAGRAMS 2nd ed. edited by T. B. Massalski (ASM, 1990), a phase separated mixture region 901 of Au and Pt is present in the lower temperature side, and a solid-solution region 902 of Au and Pt is present in the higher temperature side. Spinodal decomposition occurs in this system, and a spinodal line 903 lies between the phase separated mixture region 901 and the solid-solution region 902. An initial point 904 of room temperature (Pt: 9 at. %) is located below a dotted line drawn through extrapolating the spinodal line 903 illustrated in the phase diagram of FIG. 9 to the low temperature side. If the memory core in the state of the initial point 904 is brought to the state of a temperature increased point 905 of 180° C. through supplying an electric current, electromigration takes place at a fast rate while the temperature passes through a phase transition point 906. Thus, Pt can be caused to segregate in the desired electrode side of the memory core when the temperature is returned to room temperature. This material is also useful as a material for a device writable for any number of times.

Figure 10:
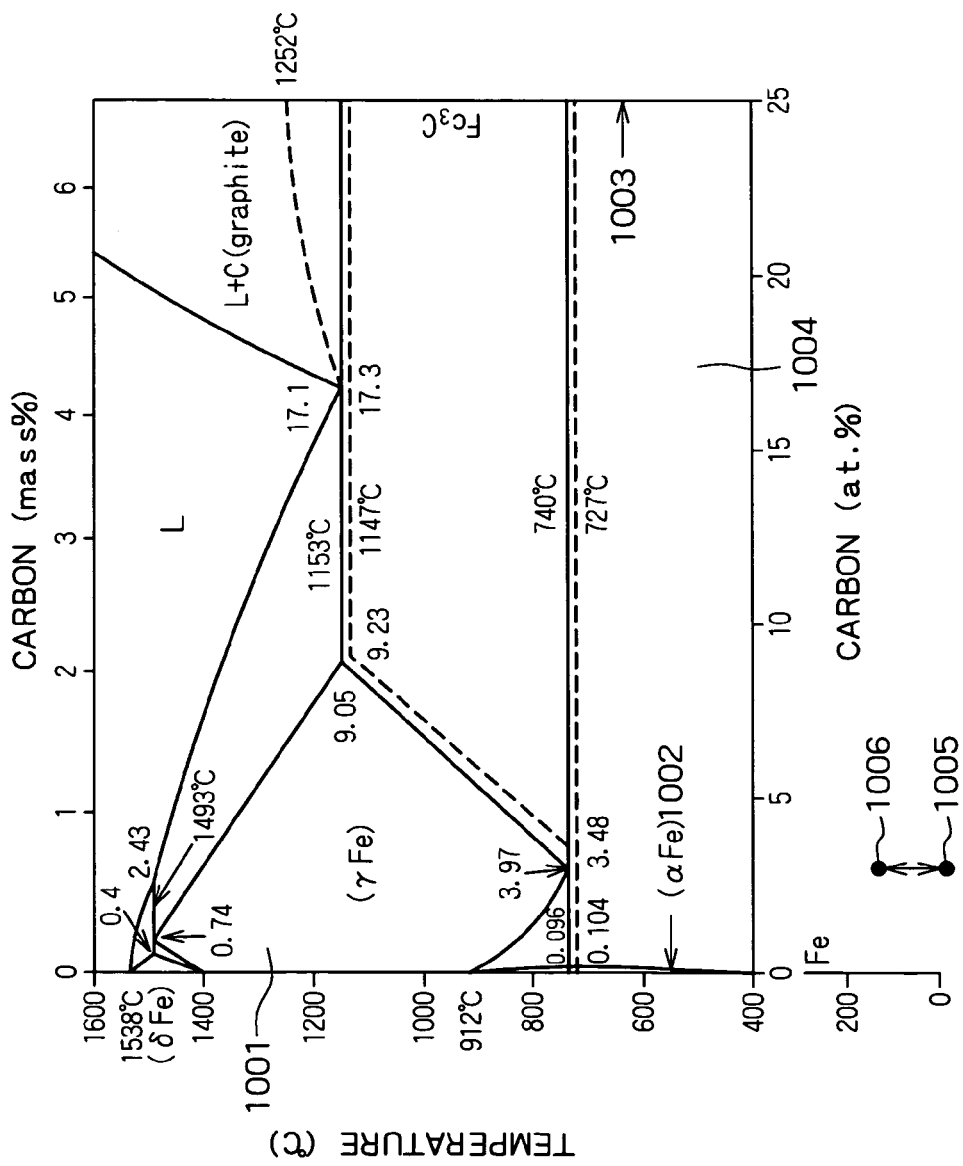
FIG. 10 is an Fe—C binary phase diagram illustrating an embodiment of the present invention.

FIG. 10 is an Fe—C binary phase diagram illustrating a fourth embodiment of the present invention. According to BINARY ALLOY PHASE DIAGRAMS 2nd ed. edited by T. B. Massalski (ASM, 1990), a γ-Fe phase region 1001 is present at a C content of approximately 9 at. % or less and a temperature of 740° C. or higher, and a phase separated mixture region 1004 of α-Fe 1002 and $Fe_3C$ 1003 is present at a temperature of 740° C. or lower. Martensitic transformation takes place at the boundary between the γ-Fe phase region 1001 and the phase separated mixture region 1004. In addition, if the alloy is quenched, the γ-Fe phase is known to be present at room temperature. An initial point 1005 of room temperature (C: 3 at. %) is located in the low temperature side of the phase diagram of FIG. 10. If the memory core in the state of the initial point 1005 is brought to the state of a temperature increased point 1006 of 180° C. through supplying an electric current, martensitic transformation takes place through the assistance of a shock of strains caused by electromigration. In this case, electromigration takes place at a fast rate, and $Fe_3C$ can be caused to segregate in the desired electrode side of the memory core. In this material, once writing is performed, the initial state is not recovered so long as the material is heated to 740° C. or higher. Therefore, this material is useful as a material for a write-once device which requires long-term reliability.

A large number of materials, besides the materials in the above embodiments, can be employed as a material for the alloy applicable to the principle of the present invention. The material may be selected in accordance with the characteristics of an electronic device to be produced.

Figure 11:
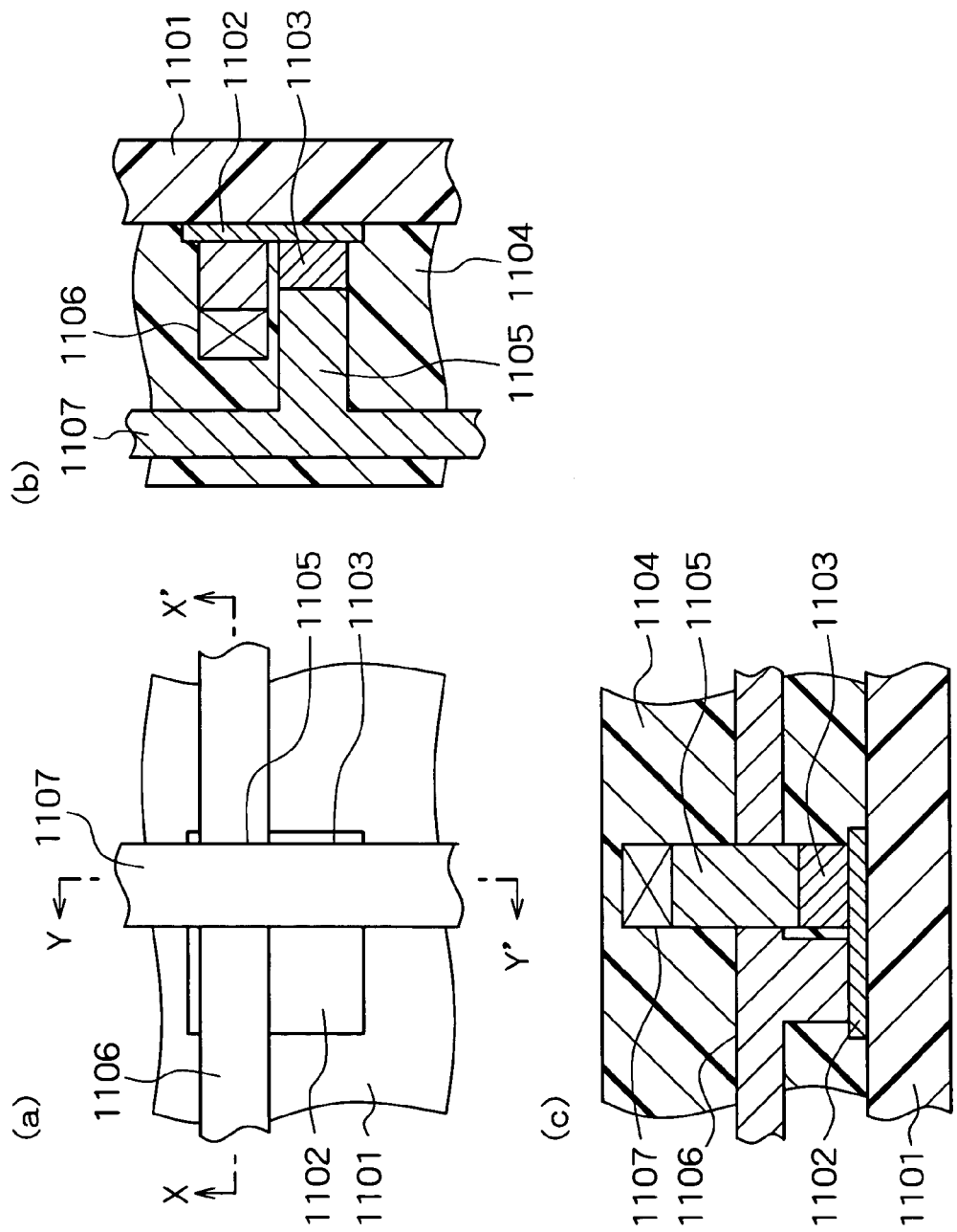
FIG. 11 includes (*a*) a projected plan view of the unit cell of the electronic device (a memory device) according to an embodiment of the present invention, (*b*) a projected left-side view of the same, and (*c*) a projected right-side view of the same.

FIG. 11 shows the unit cell structure of an electronic device (a memory apparatus) of the specific embodiment of the present invention. In this electronic device, an $Au_2Bi$ alloy is employed in the two terminal device as shown in FIG. 3. The electronic device is produced as follows.

First, an electrode A 1102 serving also as a sense electrode made of P-doped amorphous Si is formed on an insulative substrate 1101 made of polycarbonate by means of a sputtering method and a photolithography process, as shown in FIG. 11.

Subsequently, a memory core 1103 made of an Au—Bi alloy (Au: 66.7 at. %, Bi: 33.3 at. %) is formed by means of a sputtering method and a photolithography process, and a protection insulative film 1104 formed of a polymethylmethacrylate film is grown by means of a spin coating method. A hole for a bit line 1106 connected to the electrode A 1102 is formed by means of a photolithography process, and the bit line 1106 made of Cu is formed by means of a sputtering method and a photolithography process.

Subsequently, the protection insulative film 1104 is again grown by means of a spin coating method. A hole for an electrode B 1105 is then formed by means of a photolithography process, and the electrode B made of Cu and a word line 1107 are integrally formed by means of a sputtering method and an etching process. Finally, the protection insulative film 1104 is formed by means of a spin coating method to cover the entire surface.

If a plurality of the thus-formed electrical devices are arranged in lows and columns and a decoder circuit, a sense amplifier circuit, and the like are provided in accordance with a method similar to that in an ordinary semiconductor memory apparatus, a memory apparatus employing the electronic device of the present invention can be implemented.

In the above electronic device, a process of temporarily increasing the temperature of the memory core 1103 to 116° C. or higher by the Joule heat thereof generated through supplying a predetermined electric current and subsequently causing Bi to segregate in the desired electrode side can be repeatedly performed. In order to achieve the temperature of the memory core 1103 to reach the desired temperature by the Joule heat thereof, circumferential materials should be selected and designed through considering thermal diffusion.

INDUSTRIAL APPLICABILITY

According to the present invention, an electronic device utilizing a principle in which an alloy composition is biased through electromigration can be obtained with the desired characteristics.

The invention claimed is:

1. An electronic device comprising at least a memory core formed of an alloy serving as an electronic conductor and an electrode provided on each of both ends of the memory core, wherein the memory core is formed of an alloy which can utilize the non-equilibrium state or the metastable state of a solid phase, and
wherein the memory core is formed of an alloy which is in a crystallographically stable state or in a crystallographically metastable state before writing or at the time of data recording and in which a non-equilibrium state accompanying with a solid-solid phase transition can be achieved during temperature increase.

2. The electronic device according to claim 1, wherein the memory core is formed of an alloy which is a compound before writing or at the time of data recording and which includes a component in which a phase transition to another crystal phase having the same composition takes place during temperature increase.

3. The electronic device according to claim 1, wherein the memory core is formed of an alloy which is a phase separated mixture before writing or at the time of data recording and in which a compound is generated during temperature increase.

4. The electronic device according to claim 1, wherein the memory core is formed of an alloy which is a supersaturated solid-solution before writing or at the time of data recording and in which phase separation takes place during temperature increase.

5. The electronic device according to claim 1, wherein the memory core is formed of an alloy which is a phase separated mixture before writing or at the time of data recording and in which the formation of a solid-solution takes place during temperature increase.

6. The electronic device according to claim 1, wherein the memory core is formed of an alloy which is a compound before writing or at the time of data recording and which includes a component in which phase separation can take place during temperature increase.

7. The electronic device according to claim 1, wherein the memory core is formed of an alloy which is an amorphous material before writing or at the time of data recording and in which crystallization takes place during temperature increase.

8. The electronic device according to claim 1, wherein the memory core is formed of an alloy which is a supersaturated solid-solution or a phase separated mixture before writing or at the time of data recording and in which spinodal decomposition or the formation of a solid-solution which is the inverse process can take place during temperature increase.

9. The electronic device according to claim 1, wherein the memory core is formed of an alloy which is a compound or a phase separated mixture before writing or at the time of data recording and in which martensitic transformation can take place during temperature increase.

10. The electronic device according to claim 1, wherein
at least one of the electrodes connected to the memory core is formed of a semiconductor also having a function for detecting junction resistance.

11. The electronic device according to claim 1, comprising a third electrode directly connected to the memory core or a third electrode positioned in close proximity of the memory core and insulated from the memory core, the third electrode for detecting a junction resistance, resistance, an electric potential, or an electric capacity.

12. The electronic device according to claim 1, wherein
an interface between the memory core and the electrode directly connected with the memory core has a chemical potential adjusting layer having a thickness of at least 0.1 monolayers or more.

13. The electronic device according to claim 1, wherein
the composition of the alloy forming the electronic device is caused to be biased by supplying an electric current to the electronic device to thereby write data on the electronic device.

14. An integrated electronic device, wherein: a plurality of the electronic devices according to claim 1 are arranged in rows and columns; the electrode connected to one of both the ends of the memory core serves as a word line; the electrode selected from among the other electrodes of the memory core and directly provided on the memory core serves as at least a bit line; and writing-reading operation to the electronic device is achieved by selecting a word line and a bit line to access a certain electronic device of the plurality of electronic devices arranged in rows and columns.

15. An operation method for an electronic device comprising at least a memory core formed of an alloy serving as an electronic conductor and an electrode provided on each of both ends of the memory core, wherein the memory core is formed of an alloy which can utilize the non-equilibrium state or the metastable state of a solid phase, and wherein the memory core is formed of an alloy which is in a crystallographically stable state or in a crystallographically metastable state before writing or at the time of data recording, and the temperature of the memory core is changed such that the alloy is allowed to be in a non-equilibrium state accompanying with a solid-solid phase transition at the time of writing.

16. The operation method for an electronic device according to claim 15, wherein the memory core is formed of an alloy having a component which is a compound before writing or at the time of data recording, and the temperature of the memory core is changed such that a phase transition of the compound to another crystal phase having the same composition is allowed to take place at the time of writing.

17. The operation method for an electronic device according to claim 15, wherein the memory core is formed of an alloy which is a phase separated mixture before writing or at the time of data recording, and the temperature of the memory core is changed such that the phase separated mixture is allowed to generate a compound at the time of writing.

18. The operation method for an electronic device according to claim 15, wherein the memory core is formed of an alloy which is a supersaturated solid-solution before writing or at the time of data recording, and a temperature of the memory core is changed such that the supersaturated solid-solution is phase-separated at the time of writing.

19. The operation method for an electronic device according to claim 15, wherein the memory core is formed of an alloy which is a phase separated mixture before writing or at the time of data recording, and a temperature of the memory core is changed such that the phase separated mixture is allowed to form a solid-solution at the time of writing.

20. The operation method for an electronic device according to claim 15, wherein the memory core is formed of an alloy having a component which is a compound before writing or at the time of data recording, and the temperature of the memory core is changed such that the compound is allowed to phase-separate at the time of writing.

21. The operation method for an electronic device according to claim 15, wherein the memory core is formed of an alloy which is an amorphous material before writing or at the time of data recording, and the temperature of the memory core is changed such that the amorphous material is allowed to crystallize at the time of writing.

22. The operation method for an electronic device according to claim 15, wherein the memory core is formed of an alloy which is a supersaturated solid-solution or a phase-separated mixture before writing or at the time of data recording, and the temperature of the memory core is changed such that the supersaturated solid-solution or the phase-separated mixture is allowed to spinodally-decompose or form a solid-solution which is the inverse process thereof at the time of writing.

23. The operation method for an electronic device according to claim 15, wherein the memory core is formed of an alloy which is a compound or a phase separated mixture before writing or at the time of data recording, and the temperature of the memory core is changed such that martensitic transformation of the compound or the phase separated mixture is allowed to take place at the time of writing.

24. The operation method according to claim 15, wherein the composition of the alloy forming the electronic device is caused to be biased by supplying an electric current to the electronic device to thereby write data on the electronic device.

* * * * *